United States Patent
Lien

[19]

[11] Patent Number: 6,124,165
[45] Date of Patent: Sep. 26, 2000

[54] METHOD FOR MAKING OPENINGS IN A PASSIVATION LAYER OVER POLYCIDE FUSES USING A SINGLE MASK WHILE FORMING RELIABLE TUNGSTEN VIA PLUGS ON DRAMS

[75] Inventor: Wan Yih Lien, Hsin-Chu, Taiwan

[73] Assignee: Vanguard International Semiconductor Corporation, Hsin-Chu, Taiwan

[21] Appl. No.: 09/318,956

[22] Filed: May 26, 1999

[51] Int. Cl.[7] .................................................. H01L 21/8242
[52] U.S. Cl. ............................................. 438/253; 438/132
[58] Field of Search ...................................... 438/132, 253, 438/396, 601, 636, 637, 675

[56] References Cited

U.S. PATENT DOCUMENTS

| | | | |
|---|---|---|---|
| 4,536,949 | 8/1985 | Takayama et al. | 29/578 |
| 5,290,734 | 3/1994 | Boardman et al. | 437/195 |
| 5,538,924 | 7/1996 | Chen | 437/246 |
| 5,650,355 | 7/1997 | Fukuhara et al. | 437/189 |
| 5,712,206 | 1/1998 | Chen | 438/601 |
| 5,753,539 | 5/1998 | Okazaki | 438/132 |
| 5,821,160 | 10/1998 | Rodriguez et al. | 438/132 |
| 6,004,834 | 10/1998 | Tsukude et al. | 438/132 |

*Primary Examiner*—Chandra Chaudhari
*Attorney, Agent, or Firm*—George O. Saile; Stephen B. Ackerman

[57] ABSTRACT

A method for making improved fuse elements by deleting redundant circuit elements on DRAM circuits is achieved. The method involves forming fuses from a second polycide layer having a $Si_3N_4$ cap layer and sidewalls. Bit lines are also formed from the second polycide layer. After forming the node capacitors and the first metal (M1) interconnections, via holes are etched to M1 and concurrent fuse window openings are partially etched over the fuses. A tungsten metal plug in the via hole and a patterned second metal (M2) for interconnections are used to protect the via hole from overetching when the fuse window opening is completed. Next, a $Si_3N_4$ layer and a polyimide layer are deposited to complete the passivation on the DRAM. The fuse window openings and openings to the bonding pads are etched using the polyimide layer as a single photoresist mask. This method reduces the number of masking steps, and the method also avoids metal residue that could cause shorts in the fuse area, while the $Si_3N_4$ cap prevents moisture damage to the fuse. The HDP USG layer prevents moisture from entering neighboring circuits, and this enhances reliability of the chip.

28 Claims, 4 Drawing Sheets

_METHOD FOR MAKING OPENINGS IN A PASSIVATION LAYER OVER POLYCIDE FUSES USING A SINGLE MASK WHILE FORMING RELIABLE TUNGSTEN VIA PLUGS ON DRAMS_

BACKGROUND OF THE INVENTION (1) Field of the Invention

The present invention relates to the fabrication of integrated circuits, and more particularly to a method for making improved fuse structures on semiconductor integrated circuits, such as Dynamic Random Access Memory (DRAM) devices. This method uses a single masking step to etch the fuse openings in a passivation layer, while concurrently forming openings for bonding pads on the DRAM chip.

(2) Description of the Prior Art

Advances in semiconductor processing technologies, such as high-resolution photolithography and anisotropic plasma etching, are dramatically reducing the feature sizes of semiconductor devices and increasing the device packing density. Unfortunately, as the density of the semiconductor devices increases and the number of discrete devices increases on the chip, the final product yield for many integrated circuit devices (chip yield) decreases. For example, one circuit device that can experience this increase in yield loss with increased circuit elements is dynamic random access memory (DRAM) currently having 64 megabits of memory on a chip. After the year 2000 the number of memory cells is expected to increase further to about 1 to 4 gigabits, and high final product yield will be even more difficult to achieve without utilizing cell redundancy and repair yield methods.

One method of overcoming this lower yield on DRAM devices is to provide additional rows of memory cells and fusing each row of cells. Currently lasers are used to routinely open connections (fuses) in the multimegabit DRAMs to disable defective rows of memory cells and to modify the address decoder so that spare rows of memory cells are selected instead.

These fuse structures require additional processing steps that increases product cost. Typically three masking steps are required: one masking step is required to open the insulating layer over the fuse, a second mask is required to open the $Si_3N_4$ layer over the bonding pad, and a third mask to etch the openings in the polyimide passivation layer. One method of reducing process cost is to combine the process steps for making the openings in a passivation layer over fuses and at the same time to make openings to other circuit elements on the DRAM chip, such as via openings, including bonding pad openings.

Figure 1:
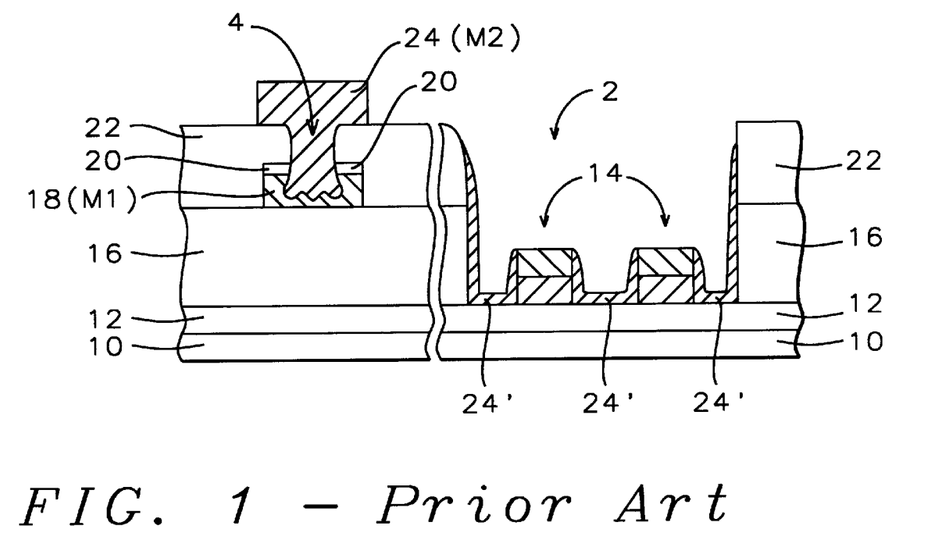
FIG. 1 is a schematic cross-sectional view, by the prior art, showing a portion of a semiconductor substrate having a fuse structure and an overetched metal in a via hole contact when a single masking step is used to etch the openings.

To better appreciate the problem associated with combining process steps for making these fuse windows and via openings, a schematic cross-sectional view of a fuse structure and a patterned first metal layer to which openings are made is depicted in FIG. 1. FIG. 1 shows a substrate 10. Typically the substrate 10 is partially completed to have diffused semiconductor devices, such as FETs having a patterned first polycide layer (not shown) for forming gate electrodes. An insulating layer 12 is then formed on the substrate to electrically insulate the devices. (These devices are not explicitly depicted in the Fig.) FIG. 1 shows a patterned second polycide layer 14 that is used to form electrical interconnections, such as bit lines for the DRAM devices. Typically the patterned polycide layer 14 includes portions for fuses, also labeled 14. Next a second insulating layer 16 is deposited and, after forming via holes (not shown), a first metal M1 layer 18 is deposited and patterned to form the next level of electrical interconnections. Typically layer 18 is aluminum/copper (Al/Cu) alloy having a titanium nitride (TiN) layer 20 on its surface that serves as an antireflective coating (ARC) when the M1 layer 18 is patterned using a photoresist mask and plasma etching. Next, a third insulating layer 22 is deposited to insulate the patterned M1 layer 18 having the ARC layer 20. Openings 2 are now etched in the insulating layers 22 and 16 over the fuses 14 to provide access for a laser abrasion, and concurrently openings 4 are etched in the insulating layer 22 to the M1 layer 18 to make contacts for the next level of metal M2. In this prior-art method, a single mask is used to etch openings 2 and 4 to reduce processing costs. Unfortunately, when the openings 2 over the fuses 14 are etched, the openings 4 for contacts are overetched causing damage to the underlying M1 layer 18 that can adversely affect the via contact resistance ($R_c$) and metal electromigration lifetime. Further, the via profile can also be degraded due to excessive overetching. Another problem results when the second metal M2 layer is deposited and patterned. When the M2 layer 24 is anisotropically etched in the openings 2 over the fuses 14, it is difficult to completely remove the M2 metal residue 24' on the sidewalls of the fuses 14 because of the step height (high aspect ratio).

Various methods for making fuses on integrated circuits have been reported. For example, Okazaki, U.S. Pat. No. 5,753,539, teaches a method for making a fuse element in the same plane as a contact pad, therefore Okazaki can etch openings for both the fuse and contact pad in the insulating layer using a single mask. Since the opening to the fuse element is much smaller than the opening for the contact pad, the microloading effect during etching results in a slower etch rate over the fuse and therefore a thin portion of the insulating layer remains over the fuse to protect the fuse from moisture, while the contact pad is exposed in the contact pad opening. Fukahara et al. in U.S. Pat. No. 5,650,355 use various methods for forming fuses and bonding pads in which the fuses are protected by an oxide nitride layer while the openings to the bonding pads are etched. Chen, U.S. Pat. Nos. 5,712,206 and 5,538,924, describes methods for making moisture-impervious guard rings and moisture-barrier layers, respectively. The methods involve forming a moisture-resistant guard ring or a layer around the fuse window openings to prevent moisture contamination of the semiconductor circuit from the fuse area. Takayama et al., U.S. Pat. No. 4,536,949, describes a method for making more accurate fuse openings without increasing costs by etching an opening over the fuse each time an insulating layer is formed over the wiring for the integrated circuit. Boardman et al. in U.S. Pat. No. 5,290,734 describe a method for making reliable anti-fuse links in which a high-resistance material (1–2 gigaohms), such as an amorphous silicon, can be altered using a voltage across the amorphous silicon link, thereby reducing the resistance to about 200 ohms. This method replaces titanium and titanium tungsten fuses and requires less space on the integrated circuit.

There is still a strong need in the semiconductor industry to further improve the method for making reliable and repeatable fuse structures which are manufacturing cost effective.

SUMMARY OF THE INVENTION

It is therefore a principal object of the present invention to provide a method for making an improved fuse structure on semiconductor integrated circuits using a single mask to concurrently etch fuse window openings for blowing fuses by laser heating, and to etch openings for bonding-pad contacts in a passivation layer.

Another object of this invention is to use a tungsten plug in the via holes to prevent excessive over-etching (erosion) of the first metal layer when both via holes and partially etched fuse window openings are etched at the same time using a single photoresist etch mask.

It is another object of this invention to utilize a single mask to complete the fuse openings in a polyimide/silicon nitride passivation layer while forming openings to bonding pads for the DRAM device, and therefore provides a more cost-effective manufacturing process.

The method allows one to make a fuse structure on a DRAM device (chip) without excessive eroding the first metal interconnections when the fuse window openings are etched to the polycide fuses on the substrate. The method utilizes a tungsten plug in the via holes to protect the first metal prior to completing the etching of the fuse openings. The method also allows one to use a single mask to complete the fuse window openings and concurrently etch the openings for the bonding pads.

The method begins by providing a semiconductor substrate, typically consisting of a lightly doped single-crystal silicon. Field oxide (FOX) regions are formed on the substrate surface surrounding and electrically isolating devices areas. Semiconductor devices, such as field effect transistors (FETs) used in integrated circuits, are formed in the device areas and are used to fabricate the DRAMs chips. The gate electrodes for the FETs are formed from a first polycide layer. The DRAMs with these improved fuse structures for deleting portions of the integrated circuit or any defective rows of memory cells in a DRAM are now made by depositing a first insulating layer, such as silicon oxide ($SiO_2$) on the substrate to electrically insulate the devices. The first insulating layer is then planarized, such as by chemical-mechanical polishing (CMP). A second polycide layer is deposited and a silicon nitride ($Si_3N_4$) cap layer is formed on the second polycide layer. The cap layer and the second polycide layer are patterned to form bit lines in memory cell areas of the DRAMs, and to form local interconnections having portions for fuses. $Si_3N_4$ sidewall spacers are formed on the sidewalls of the patterned second polycide layer. A second insulating layer is deposited over the patterned second polycide layer, and is planarized to form an interlevel dielectric layer (ILD) over the bit lines. Contact openings are etched in the second and first insulating layers to the substrate and extend over the bit lines to form self-aligned node contact openings for the capacitors in the memory cell areas. A doped polysilicon layer is deposited to fill the node contact openings and is patterned over the node contact openings. The DRAM capacitors can now be formed by conventional means. A third insulating layer, commonly referred to as an interlevel dielectric (ILD) layer, is deposited over the second insulating layer and over the node capacitors. The third insulating layer is then planarized to reduce the rough topography due to the node capacitors. After forming via holes in the third insulating layer, a first metal layer, such as aluminum/copper (Al/Cu), is deposited and an anti-reflective coating (ARC) layer is deposited on the first metal layer. The ARC layer and the first metal layer are patterned to form the next level of electrical interconnections. A fourth insulating layer, also referred to as an intermetal dielectric (IMD) layer, is deposited. Via holes are etched in the fourth insulating layer to the ARC layer on the patterned first metal layer, and concurrently wider fuse window openings are etched in the fourth insulating layer over portions of the second polycide layer used for the fuses. The fuse window openings are also etched partially into the third insulating layer, while the ARC layer prevents overetching of the first metal layer. A titanium nitride adhesion layer is deposited, and a tungsten refractory metal layer is deposited and etched back to the adhesion layer to form tungsten metal plugs in the via holes. During the etching, the tungsten metal is removed in the bottom of the fuse window openings. A second metal layer, such as Al/Cu, is deposited and patterned by plasma etching to form the next level of metal inter-connections including metal bonding pads. During etching, the second metal in the bottom of the fuse window openings is removed. Overetching is used to remove the adhesion layer and results in a further reduction of the third insulating layer over the fuses in the fuse window openings. Next, a passivation layer is deposited. The passivation layer is formed by depositing a conformal $Si_3N_4$ layer followed by the deposition of a much thicker polyimide layer. By the method of this invention, a single photoresist mask and anisotropic etching are used to etch openings for the bonding pads in the passivation layer to the second metal layer and to etch the passivation layer to the remaining third insulating layer in the fuse window openings. With the photoresist mask still in place the remaining third insulating layer and the second insulting layer are removed down to the $Si_3N_4$ cap layer on the polycide fuse. The insulating layers are removed using a high etch-rate selectivity of $SiO_2$ to $Si_3N_4$. This completes the formation of the fuse structure on the DRAM for laser abrasion. The method prevents metal residue over the fuse areas that can result in shorts, and the $Si_3N_4$ sidewalls and cap layer prevent damage due to moisture during the long period between completion of the wafer and testing.

DESCRIPTION OF THE PREFERRED EMBODIMENT

The present invention relates to a method for forming improved fuse structures for integrated circuits. The method uses a tungsten plug in the via holes to prevent overetching the underlying metal interconnections when fuse window openings are formed. The method also allows a single mask to be used for etching both the fuse window openings and bonding-pad openings in a polyimide passivation layer, while a nitride cap and sidewall spacers protect the polycide fuse from moisture damage. The method for making this fuse structure is described specifically for forming fuses on DRAM circuits. The method improves yield by blowing the fuses to remove rows or columns of defective memory cells and then activating spare rows or columns of good memory cells. However, it should be well understood by those skilled in the art that the method is generally applicable for customizing integrated circuits.

Figure 2:
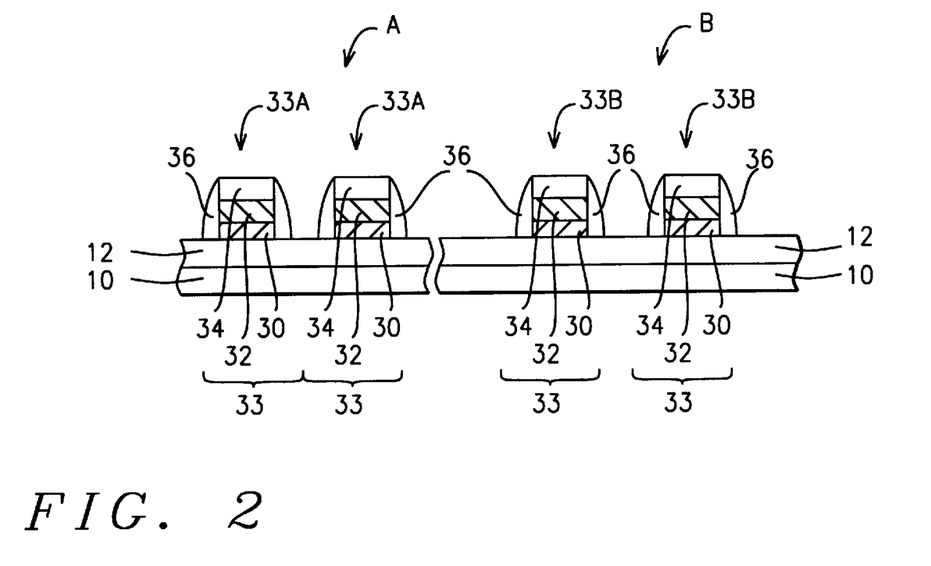
FIGS. 2 through 7 show schematic cross-sectional views for the sequence of process steps for forming an improved fuse structure using a tungsten plug to prevent overetching in the via hole when forming the fuse window openings by the method of this invention.

The method begins by providing a semiconductor substrate 10, as shown in FIG. 2. The substrate commonly used in the semiconductor industry is composed of single-crystal silicon having a <100> crystallographic orientation and is doped with a P type conductive dopant, such as boron. The details of the semiconductor devices, typically FETs, formed in and on the substrate are not explicitly depicted in the Figs. to simplify the drawings and the discussion, but generally are fabricated by forming a field oxide (FOX) on the silicon substrate to surround and electrically isolate device areas. A thin gate oxide is grown on the device areas, and a first polycide layer is patterned to form gate electrodes for the FETs. The FETs are completed by forming source/drain areas adjacent to the gate electrodes, for example by ion implantation.

Still referring to FIG. 2, the method for making DRAMs with these improved fuse structures is now described in detail. After forming the FETs, a first insulating layer 12 is deposited on the substrate 10 to electrically insulate the devices. Layer 12 is preferably a silicon oxide ($SiO_2$) and is deposited by chemical vapor deposition using a reactant gas such as tetraethosiloxane (TEOS). The first insulating layer 12 is deposited to a thickness of between about 8000 and 12000 Angstroms, and is planarized, for example by chemical-mechanical polishing (CMP).

Continuing with FIG. 2, a doped polysilicon layer 30 and a refractory metal silicide layer 32 are deposited to form a second polycide layer 33. Typically the polysilicon layer 30 is deposited by low-pressure chemical vapor deposition (LPCVD) using, for example, silane ($SiH_4$) as the reactant gas, and is doped either by ion implantation or in situ during deposition with phosphorus to a concentration of between about 2.0 E 20 and 5.0 E 20 atoms/$cm^3$. Polysilicon layer 30 is deposited to a thickness of between about 500 and 1000 Angstroms. The refractory metal silicide layer 32 is preferably a tungsten silicide ($WSi_x$) and is deposited by CVD using tungsten hexafluoride ($WF_6$) and $SiH_4$ as the reactant gases. The silicide layer 32 is deposited to a preferred thickness of between about 1000 and 2000 Angstroms. Next, a cap layer 34 is formed on the second polycide layer 33. Cap layer 34 is preferably silicon nitride ($Si_3N_4$), deposited by LPCVD using a reactant gas mixture such as dichlorosilane ($SiCl_2H_2$) and ammonia ($NH_3$), and is deposited to a thickness of between about 1500 and 2500 Angstroms. The $Si_3N_4$ cap layer 34 and the second polycide layer 33 are patterned to form bit lines 33A in the memory cell areas of the DRAMs, as depicted in Region A of FIG. 2, and to form local interconnections 33B having portions for fuses, also labeled 33B, as depicted in Region B of FIG. 2. Conventional photolithographic techniques and anisotropic plasma etching are used to pattern the cap layer 34 and the second polycide layer 33. The anisotropic plasma etching can be carried out, for example in a reactive ion etcher (RIE) using an etchant gas mixture such as $C_2F_6$, $C_4F_8$, $CH_3F$, and Ar to etch the cap layer 34, and an etchant gas mixture such as $BCl_3$ and $Cl_2$ to etch the polycide layer 33. Next, a blanket conformal $Si_3N_4$ layer 36 is deposited, for example by LPCVD, and is anisotropically etched back to form $Si_3N_4$ sidewall spacers 36, having a width of between about 400 and 1000 Angstroms, on the sidewalls of the patterned second polycide layer 33.

Figure 3:
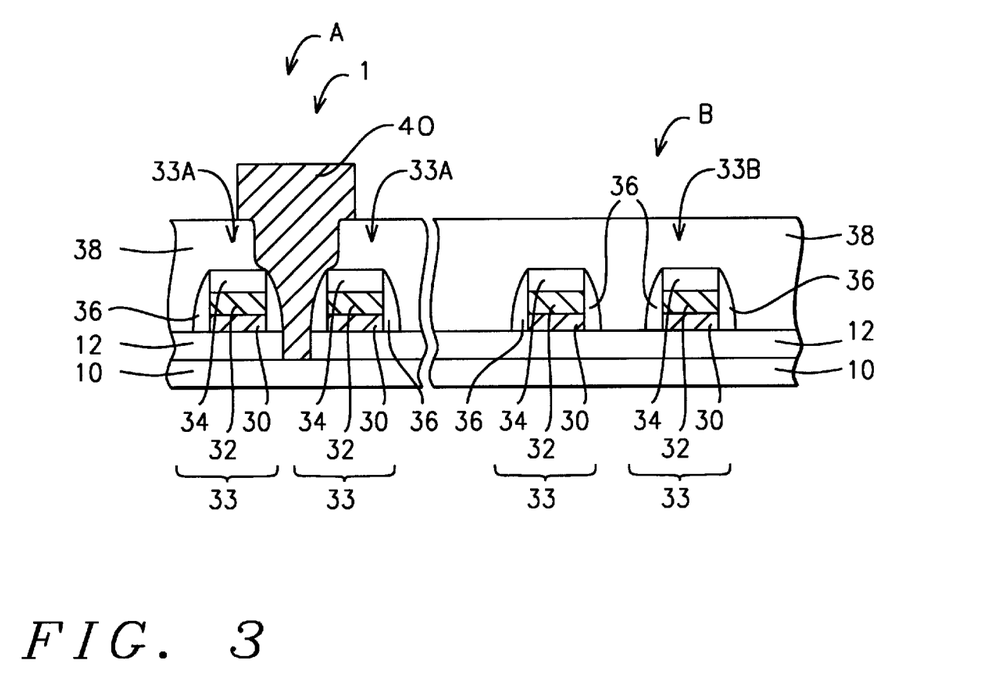

Referring to FIG. 3, a second insulating layer 38 is deposited over the patterned capped second polycide layer 33. The second insulating layer 38 is an undoped silicate glass (USG), such as $SiO_2$, and is deposited by high-density-plasma (HDP) CVD to provide good gap filling between the narrowly spaced bit lines 33A for deep submicron DRAM generation. The HDP USG prevents moisture from entering the neighboring circuits. The deposition of layer 38 is carried out using a reactant gas such as $SiH_4$, $O_2$, and Ar. The second insulating layer 38, commonly referred to as an interlevel dielectric (ILD) layer, is deposited and planarized by CMP to have a thickness of between about 4000 and 8000 Angstroms over the patterned second polycide layer.

Still referring to FIG. 3, capacitor node contact openings 1 for DRAM devices are etched in the second and first insulating layers 38 and 12 to the substrate. The node contact openings 1 are etched between the bit lines 33A and extend over the bit lines to form self-aligned node contact openings for the capacitors in the memory cell areas, as shown in Region A of FIG. 3. For example, the node contact openings 1 are etched using reactive ion etching (RIE) and an etchant gas such as $C_4F_8$, $CH_2F_2$, and Ar that selectively etches $SiO_2$ layer 38 to the $Si_3N_4$ cap layer 34 and to the $Si_3N_4$ sidewall spacers 36. Next, a doped polysilicon layer 40 is deposited to fill the node contact openings 1. Layer 40 is deposited by LPCVD using $SiH_4$, and is in-situ doped with phosphorus to a concentration of between about 2.0 E 20 and 5.0 E 20 atoms/$cm_3$. The DRAM capacitors can now be formed by conventional means, but are not explicitly depicted in the drawings. For example, capacitors having shapes such as cylindrical, fin shaped, and the like can be made by including additional processing steps to form a thin inter-electrode dielectric layer and top electrodes. FIG. 3 depicts the capacitor, without details, and is also labeled 40.

Figure 4:
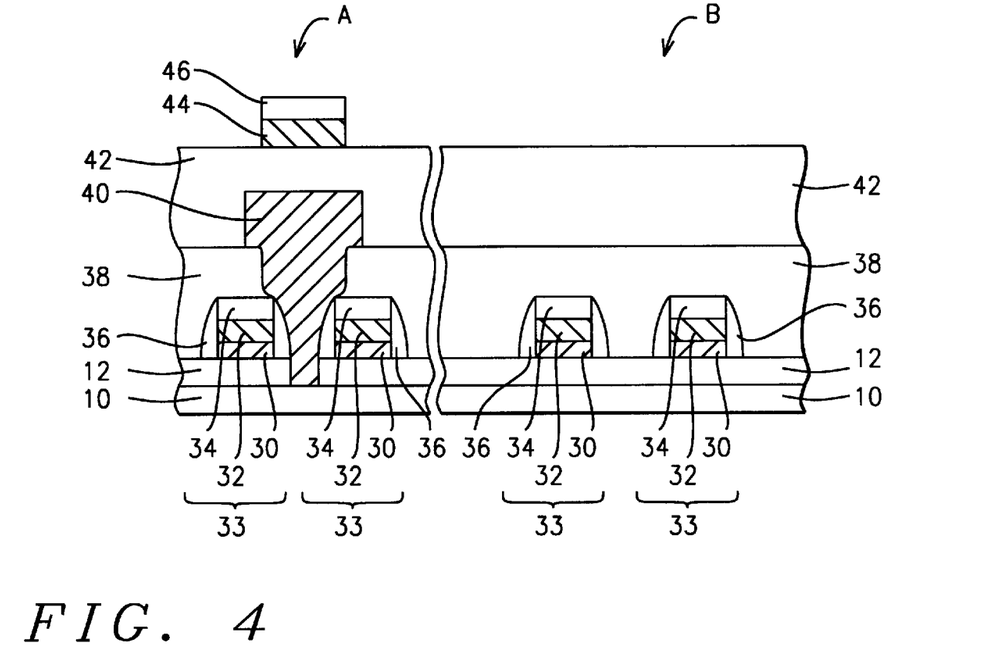

Referring to FIG. 4, a third insulating layer 42, commonly referred to as an ILD layer, is deposited over the second insulating layer 38 and over the node capacitors 40. Layer 42 is USG $SiO_2$ deposited by HDP-CVD to a thickness of between about 12000 and 16000 Angstroms. Layer 42 is then globally planarized by CMP to reduce the step height between the memory cell areas and the periphery of the DRAM chip.

Referring still to FIG. 4, via holes (not shown) for interlevel connections are formed in the third insulating layer 42. A first metal layer 44 is deposited. Layer 44 is preferably Al/Cu and is deposited by physical vapor deposition, such as by sputter deposition, to a thickness of between about 3000 and 5000 Angstroms. Next, an anti-reflective coating (ARC) layer 46 is deposited on the first metal layer 44. The ARC layer 46 is preferably titanium nitride (TiN) and is deposited, for example, by sputter deposition from a Ti target in a nitrogen ambient. The ARC layer 46 is relatively thick, for example, it is deposited to a thickness of between about 1000 and 1500 Angstroms. The ARC layer 46 and the first metal layer 44 are patterned using conventional photolithographic techniques and anisotropic plasma etching to form the next level of electrical interconnections. For example, the plasma etching can be carried out using RIE and an etchant gas mixture such as $BCl_3$, $Cl_2$, and $CHF_3$ for etching the ARC layer 46 and $BCl_3$, $Cl_2$, $CHF_3$, and $N_2$ for etching the first metal layer 44.

Figure 5:
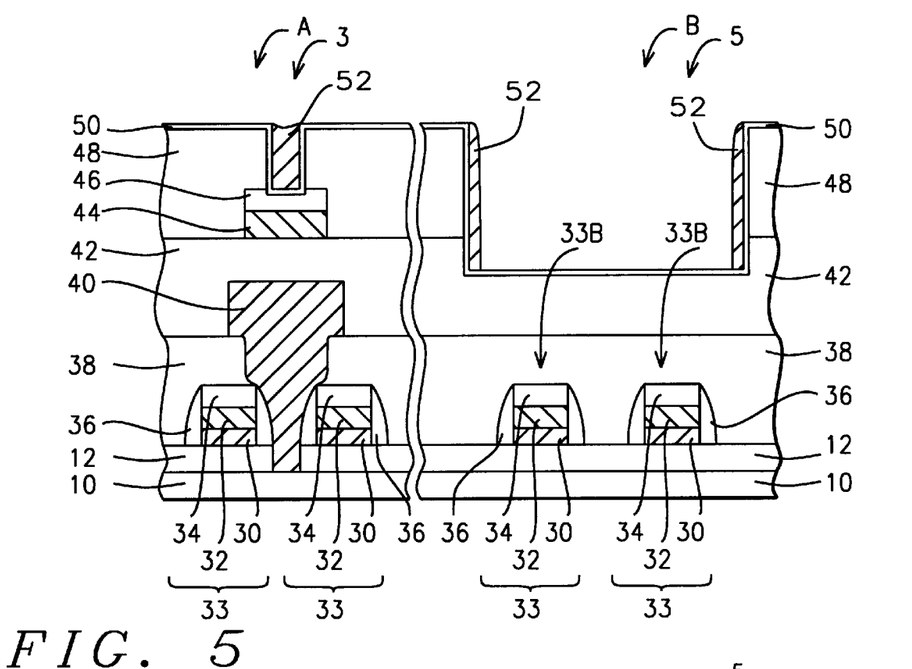

Referring to FIG. 5, a fourth insulating layer 48, also referred to as an intermetal dielectric (IMD) layer, is deposited. The fourth insulating layer 48 is a $SiO_2$, deposited by plasma-enhanced CVD (PECVD) to a thickness of between about 6000 and 12000 Angstroms.

Continuing with FIG. 5 and a key feature of this invention, via holes 3 are etched in the fourth insulating layer 48 to the ARC layer 46 on the patterned first metal layer 44, and concurrently wider fuse window openings 5 are etched in the fourth insulating layer 48 over portions of the second polycide layer used for the fuses 33B. The relatively thick ARC layer 46 allows the fuse window openings 5 to be significantly overetched while controlling the etch depth of the fuse window openings. This allows the fuse window openings 5 to be etched partially into the third insulating layer 42 over the fuses 33B to control the thickness of the insulating layers over the fuses.

Still referring to FIG. 5, and another key feature of this invention is to form a metal plug in the via hole 3. The metal plug protects the first metal in the via hole from etching during subsequent processing. The plug is formed by first depositing a titanium nitride adhesion layer 50, followed by the deposition of a refractory metal layer 52. The TiN layer 50 is deposited preferably by sputter deposition from a Ti target in a nitrogen ambient and is deposited to a thickness of between about 600 and 1200 Angstroms. The refractory metal layer 52 is preferably tungsten (W) and is deposited by CVD using a reactant gas such as $WF_6$. The W layer 52 is deposited sufficiently thick to fill the submicron via holes 3, while thin enough to form a conformal coating within the wider fuse window openings 5. The W layer 52 is then blanket etched back using anisotropic plasma etching to the adhesion layer 50 to form tungsten metal plugs 52 in the via holes 3. RIE and an etchant gas mixture such as $SF_6$, $N_2$, and He is used to etch back the tungsten 52. During the etching, the tungsten metal is removed in the bottom of the fuse window openings 5 but a portion of the tungsten remains on the sidewalls of the fuse window openings 5.

Figure 6:
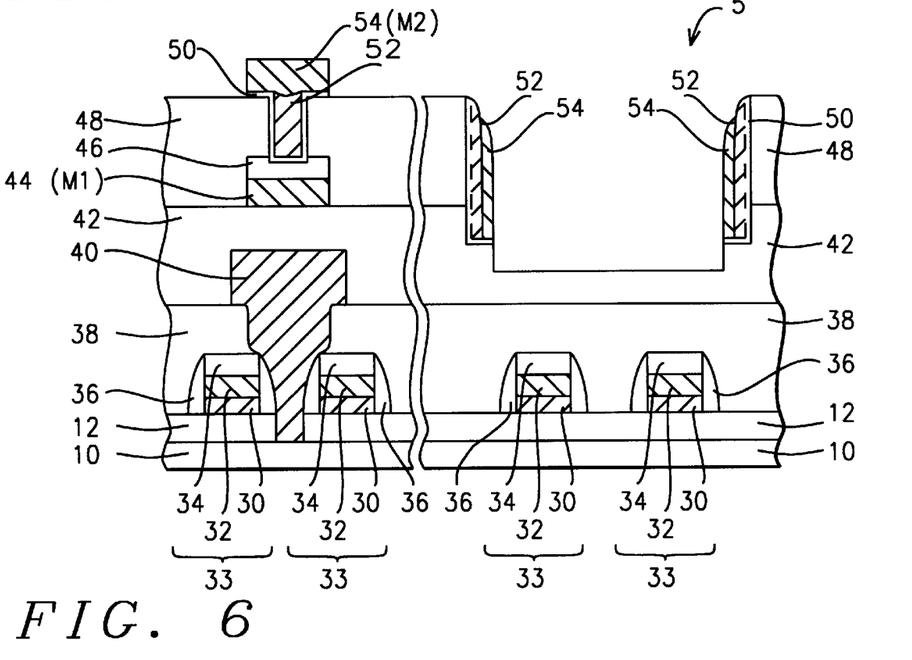

Referring to FIG. 6, a second metal layer 54 is deposited on the adhesion layer 50, over the tungsten plugs 52, and also forms a conformal coating in the fuse window openings 5. The second metal (M2) layer 54 is preferably Al/Cu, is deposited by physical vapor deposition such as by sputter deposition, and is deposited to a thickness of between about 6000 and 10000 Angstroms. Conventional photolithographic techniques and anisotropic plasma etching are used to pattern the M2 layer 54 to form the next level of metal interconnections, as depicted for the metal line 54 over the W plug 52 in FIG. 6. The TiN adhesion layer 50 is also etched to the surface of the fourth insulating layer 48 when the second metal is patterned. The bonding pads (not shown) are also formed when the M2 layer 54 is patterned. Typically the plasma etching is carried out using RIE and an etchant gas mixture such as $BCl_3$, $Cl_2$, $CHF_3$, and $N_2$. The second metal is removed in the bottom of the fuse window openings 5 during etching, but portions of the second metal 54 remain on the sidewalls of the fuse window openings 5. During overetching of the second metal layer 54 to remove the adhesion layer 50, the third insulating layer 42 in the fuse window openings 5 is further reduced by about 2000 Angstroms.

Figure 7:
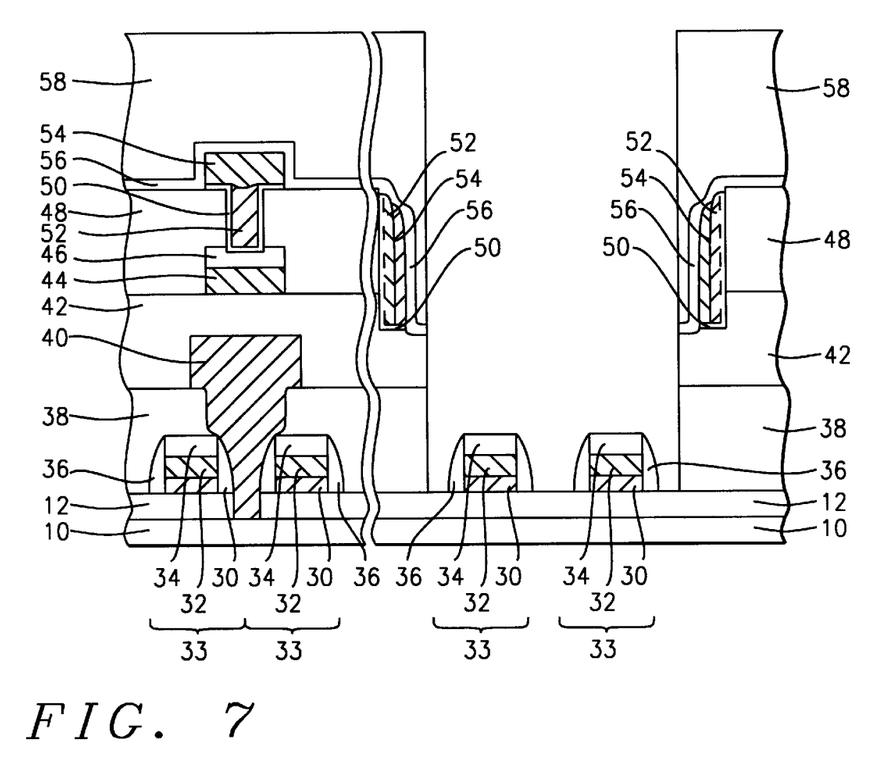

Referring now to FIG. 7, a conformal $Si_3N_4$ layer 56 is deposited over the patterned second metal layer as a part of a passivation layer to protect the devices on the substrate from ion and moisture contamination. The $Si_3N_4$ layer 56 is deposited preferably by plasma-enhanced CVD at a relatively low temperature of about 300° C. using a reactant gas mixture such as $SiH_4$ and $NH_3$. The $Si_3N_4$ layer 56 is deposited to a thickness of between about 4000 and 8000 Angstroms. A thick polyimide layer 58 is deposited, for example by spin coating and is cured to complete the passivation layer. The polyimide layer 58 is deposited to a thickness of between about 70000 and 90000 Angstroms.

Still referring to FIG. 7, and another key feature of this invention, the polyimide layer 58, which also serves as a photoresist mask, and anisotropic etching are used to etch openings in the $Si_3N_4$ layer 56 to the bonding pads (not shown) formed from the M2 layer 54, and concurrently the $Si_3N_4$ layer 56 is etched in the bottom of the fuse window openings 5 to the third insulating layer 42. With the polyimide photoresist still in place, the remaining third insulating layer 42 and the second insulting layer 38 are selectively etched down to the $Si_3N_4$ cap layer 34 on the polycide fuses (layers 33B). The insulating layers 42 and 38 are removed using a high etch-rate selectivity of $SiO_2$ to $Si_3N_4$. For example, the etching can be carried out using RIE and an etchant gas mixture such as $C_4F_8$, $CH_2F_2$, and Ar having an etch-rate selectivity of oxide to nitride of at least greater than 20:1. This completes the formation of the fuse structure on the DRAM for blowing out fuses by laser heating. This method avoids metal residue over the fuse areas that can result in shorts, as would occur in the prior art of FIG. 1, and the $Si_3N_4$ sidewalls 36 and cap layer 34 prevent damage due to moisture during the long period between completion of the wafer and testing. Also, the HDP USG oxide second and third insulating layers prevent moisture from entering the neighboring circuits, thereby improving chip reliability.

While the invention has been particularly shown and described with reference to the preferred embodiment thereof, it will be understood by those skilled in the art that various changes in form and details may be made without departing from the spirit and scope of the invention.

What is claimed is:

1. A method for making fuses for Dynamic Random Access Memory (DRAM) circuits comprising the steps of:

providing a semiconductor substrate having devices in device areas surrounded by a field oxide isolation, said devices formed in part from a patterned first polycide layer;

forming a planar first insulating layer on said substrate over said devices;

depositing a second polycide layer and a cap layer on said first insulating layer;

patterning said cap layer and said second polycide layer to form bit lines in memory cell areas of said DRAMs, and to form local interconnections having portions for fuses, and forming sidewall spacers on sidewalls of said patterned second polycide layer;

depositing a second insulating layer over said patterned second polycide layer, and planarizing said second insulating layer;

etching contact openings in said second insulating layer over said bit lines and in said first insulating layer to said substrate for self-aligned node capacitors in said memory cell areas;

depositing a doped polysilicon layer on said second insulating layer and in said contact openings; p1 patterning said polysilicon layer to form self-aligned node contacts in said contact openings and forming said node capacitors, one on each of said node contacts;

depositing a third insulating layer over said second insulating layer and said node capacitors, and planarizing said third insulating layer;

depositing a first metal layer and an anti-reflective coating (ARC) layer;

patterning said ARC layer and said first metal layer to form electrical interconnections;

depositing a fourth insulating layer;

etching via holes in said fourth insulating layer to said ARC layer on said patterned first metal layer, and concurrently etching wider fuse window openings over portions of said second polycide layer used for said fuses, said fuse window openings etched in said fourth and partially into said third insulating layers, while said ARC layer prevents overetching of said first metal layer;

depositing an adhesion layer, and depositing a refractory metal layer and etching back to form refractory metal plugs in said via holes while removing said refractory metal in said fuse window openings;

depositing a second metal layer and patterning to form metal interconnections including metal bonding pads, said patterning removing said second metal in said fuse window openings, and further etching said third insulating layer over said fuses in said fuse window openings;

depositing a passivation layer over said substrate;

using a single photoresist mask and anisotropic etching to etch said passivation layer to said second metal layer to form openings for said bonding pads and etching in said fuse window openings to said third insulating layer;

etching selectively said third insulating layer and said second insulating layer to said cap layer on said second polycide layer to complete said fuse window openings to said fuses.

2. The method of claim 1, wherein said second polycide layer is a doped polysilicon layer having a thickness of between about 500 and 1000 Angstroms, and an upper tungsten silicide layer having a thickness of between about 1000 and 2000 Angstroms.

3. The method of claim 1, wherein said cap layer is silicon nitride deposited to a thickness of between about 1500 and 2500 Angstroms.

4. The method of claim 1, wherein said sidewall spacers are formed by depositing a silicon nitride layer and anisotropically etching back to form said sidewall spacers to have a thickness of between about 400 and 1000 Angstroms.

5. The method of claim 1, wherein said second insulating layer is silicon oxide deposited by high-density-plasma chemical vapor deposition to a thickness of between about 4000 and 8000 Angstroms.

6. The method of claim 1, wherein said doped poly-silicon layer is deposited to a thickness sufficient to fill said contact openings and is in-situ doped with an N type conductive dopant to a concentration of between about $1.0 \text{ E } 19$ and $1.0 \text{ E } 21$ atoms/cm$^3$.

7. The method of claim 1, wherein said third insulating layer is silicon oxide deposited by chemical vapor deposition to a thickness of between about 12000 and 16000 Angstroms.

8. The method of claim 1, wherein said first metal layer is aluminum/copper and is deposited to a thickness of between about 3000 and 5000 Angstroms.

9. The method of claim 1, wherein said anti-reflective coating layer is titanium nitride deposited to a thickness of between about 1000 and 1500 Angstroms.

10. The method of claim 1, wherein said fourth insulating layer is silicon oxide deposited by plasma-enhanced chemical vapor deposition to a thickness of between about 6000 and 12000 Angstroms.

11. The method of claim 1, wherein said adhesion layer is titanium nitride deposited to a thickness of between about 600 and 1200 Angstroms.

12. The method of claim 1, wherein said refractory metal layer is tungsten and is deposited to a thickness of between about 5000 and 10000 Angstroms.

13. The method of claim 1, wherein said second metal layer is aluminum/copper and is deposited to a thickness of between about 6000 and 10000 Angstroms.

14. The method of claim 1, wherein said passivation layer consists of a silicon nitride layer deposited to a thickness of between about 4000 and 8000 Angstroms, and an upper layer of polyimide deposited to a thickness of between about 70000 and 90000 Angstroms.

15. A method for making fuses for Dynamic Random Access Memory (DRAM) circuits comprising the steps of:

providing a semiconductor substrate having devices in device areas surrounded by a field oxide isolation, said devices formed in part from a patterned first polycide layer;

forming a planar first insulating layer on said substrate over said devices;

depositing a second polycide layer and a silicon nitride cap layer on said first insulating layer;

patterning said cap layer and said second polycide layer to form bit lines in memory cell areas of said DRAMs, and to form local interconnections having portions for fuses, and forming sidewall spacers on sidewalls of said patterned second polycide layer;

depositing a second insulating layer over said patterned second polycide layer, and planarizing said second insulating layer;

etching contact openings in said second insulating layer over said bit lines and in said first insulating layer to said substrate for self-aligned node capacitors in said memory cell areas;

depositing a doped polysilicon layer on said second insulating layer and in said contact openings;

patterning said polysilicon layer to form self-aligned node contacts in said contact openings and forming said node capacitors, one on each of said node contacts;

depositing a third insulating layer over said second insulating layer and said node capacitors, and planarizing said third insulating layer;

depositing a first metal layer and an anti-reflective coating (ARC) layer;

patterning said ARC layer and said first metal layer to form electrical interconnections;

depositing a fourth insulating layer;

etching via holes in said fourth insulating layer to said ARC layer on said patterned first metal layer, and concurrently etching wider fuse window openings over portions of said second polycide layer used for said fuses, said fuse window openings etched in said fourth and partially into said third insulating layers, while said ARC layer prevents overetching of said first metal layer;

depositing a titanium nitride adhesion layer, and depositing a tungsten refractory metal layer and etching back to form tungsten metal plugs in said via holes while removing said tungsten metal in said fuse window openings;

depositing a second metal layer and patterning to form metal interconnections including metal bonding pads, said patterning removing said second metal in said fuse window openings, and further etching said third insulating layer over said fuses in said fuse window openings;

depositing a passivation layer, composed of a silicon nitride layer and an upper polyimide layer, over said substrate;

using a single photoresist mask and anisotropic etching to etch said passivation layer to said second metal layer to form openings for said bonding pads and etching in said fuse window openings to said third insulating layer;

etching selectively said third insulating layer and said second insulating layer to said cap layer on said second polycide layer to complete said fuse window openings to said fuses.

16. The method of claim 15, wherein said second polycide layer is a doped polysilicon layer having a thickness of between about 500 and 1000 Angstroms, and an upper tungsten silicide layer having a thickness of between about 1000 and 2000 Angstroms.

17. The method of claim 15, wherein said silicon nitride cap layer is deposited to a thickness of between about 1500 and 2500 Angstroms.

18. The method of claim 15, wherein said sidewall spacers are formed by depositing a silicon nitride layer and anisotropically etching back to form said sidewall spacers to have a thickness of between about 400 and 1000 Angstroms.

19. The method of claim 15, wherein said second insulating layer is silicon oxide deposited by high-density-plasma chemical vapor deposition to a thickness of between about 4000 and 8000 Angstroms.

20. The method of claim 15, wherein said doped polysilicon layer is deposited to a thickness sufficient to fill said contact openings and is in-situ doped with an N type conductive dopant to a concentration of between about $1.0$ E 19 and $1.0$ E 21 atoms/cm$^3$.

21. The method of claim 15, wherein said third insulating layer is silicon oxide deposited by chemical vapor deposition to a thickness of between about 12000 and 16000 Angstroms.

22. The method of claim 15, wherein said first metal layer is aluminum/copper and is deposited to a thickness of between about 3000 and 5000 Angstroms.

23. The method of claim 15, wherein said anti-reflective coating layer is titanium nitride deposited to a thickness of between about 1000 and 1500 Angstroms.

24. The method of claim 15, wherein said fourth insulating layer is silicon oxide deposited by plasma-enhanced chemical vapor deposition to a thickness of between about 6000 and 12000 Angstroms.

25. The method of claim 15, wherein said titanium nitride adhesion layer is deposited to a thickness of between about 600 and 1200 Angstroms.

26. The method of claim 15, wherein said tungsten refractory metal layer is deposited to a thickness of between about 5000 and 10000 Angstroms.

27. The method of claim 15, wherein said second metal layer is aluminum/copper and is deposited to a thickness of between about 6000 and 10000 Angstroms.

28. The method of claim 15, wherein said silicon nitride portion of said passivation layer is deposited to a thickness of between about 4000 and 8000 Angstroms, and said polyimide layer is deposited to a thickness of between about 70000 and 90000 Angstroms.

* * * * *